(12) United States Patent
Komori et al.

(10) Patent No.: US 8,288,816 B2
(45) Date of Patent: Oct. 16, 2012

(54) SEMICONDUCTOR MEMORY DEVICE AND METHOD FOR MANUFACTURING SAME

(75) Inventors: Yosuke Komori, Mie-ken (JP); Masaru Kidoh, Mie-ken (JP); Ryota Katsumata, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 12/813,895

(22) Filed: Jun. 11, 2010

(65) Prior Publication Data
US 2011/0215394 A1  Sep. 8, 2011

(30) Foreign Application Priority Data
Mar. 5, 2010  (JP) .................................. 2010-048839

(51) Int. Cl.
*H01L 27/115* (2006.01)
(52) U.S. Cl. ..................... 257/324; 365/185.17; 438/270
(58) Field of Classification Search .................. 257/324; 365/185.17; 438/270
See application file for complete search history.

(56) References Cited

U.S. PATENT DOCUMENTS

| | | | |
|---|---|---|---|
| 2007/0159878 A1* | 7/2007 | Choi et al. ..................... | 365/163 |
| 2007/0252201 A1 | 11/2007 | Kito et al. | |
| 2008/0173928 A1* | 7/2008 | Arai et al. ..................... | 257/316 |

FOREIGN PATENT DOCUMENTS

JP   2009-146954    7/2009
WO   WO 2009/075370 A1   6/2009

OTHER PUBLICATIONS

U.S. Appl. No. 12/679,991, filed Mar. 25, 2010, Yoshiaki Fukuzumi et al.

* cited by examiner

*Primary Examiner* — Thomas L Dickey
(74) *Attorney, Agent, or Firm* — Oblon, Spivak, McClelland, Maier & Neustadt, L.L.P.

(57) ABSTRACT

According to one embodiment, a semiconductor memory device includes a base, a stacked body, a memory film, a channel body, a contact plug, a global bit line, and a plurality of local bit lines. The base has a substrate and a peripheral circuit formed on the substrate. The stacked body has a plurality of conductive layers and insulating layers stacked alternately above the base. The memory film includes a charge storage film provided on an inner wall of a memory hole formed in a stacking direction of the stacked body. The channel body is provided inside the memory film in the memory hole. The contact plug is provided by piercing the stacked body. The global bit line is provided between the peripheral circuit and the stacked body and connected to a lower end portion of the contact plug. The plurality of local bit lines are provided above the stacked body and divided in an extending direction of the plurality of local bit lines. The plurality of local bit lines are connected to the channel body and commonly connected to the global bit line through the contact plug.

14 Claims, 7 Drawing Sheets

SEMICONDUCTOR MEMORY DEVICE AND METHOD FOR MANUFACTURING SAME

CROSS-REFERENCE TO RELATED APPLICATION

This application is based upon and claims the benefit of priority from the prior Japanese Patent Application No. 2010-048839, filed on Mar. 5, 2010; the entire contents of which are incorporated herein by reference.

FIELD

Embodiments described herein relate generally to a semiconductor memory device and a method for manufacturing same.

BACKGROUND

Conventional non-volatile semiconductor memory device (memory) has integrated elements in a two-dimensional plane on a silicon substrate. Increase of memory capacity has been achieved with downsizing a size of one element, however recently the downsizing has been getting more difficult costly and technologically.

In contrast, a collectively processed three-dimensional stacked memory has been proposed. The collectively processed three-dimensional stacked memory is provided with a stacked body including insulating films and electrode films alternately stacked, a silicon pillar piercing the stacked body and a charge storage layer (memory layer) between the silicon pillar and the electrode film, and thereby a memory cell is provided at an intersection of the silicon pillar and respective electrode films.

Furthermore, for example, JP-A 2009-146954 discloses a technique three-dimensionally arraying memory cells by forming a memory hole in a stacked body alternately stacking conductive layers functioning as a control gate of a memory device and insulating layers, and forming a charge storage film on an inner wall of the memory hole and subsequently providing silicon in the memory hole.

DETAILED DESCRIPTION

According to one embodiment, a semiconductor memory device includes a base, a stacked body, a memory film, a channel body, a contact plug, a global bit line, and a plurality of local bit lines. The base has a substrate and a peripheral circuit formed on the substrate. The stacked body has a plurality of conductive layers and insulating layers stacked alternately above the base. The memory film includes a charge storage film provided on an inner wall of a memory hole formed in a stacking direction of the stacked body. The channel body is provided inside the memory film in the memory hole. The contact plug is provided by piercing the stacked body. The global bit line is provided between the peripheral circuit and the stacked body and connected to a lower end portion of the contact plug. The plurality of local bit lines are provided above the stacked body and divided in an extending direction of the plurality of local bit lines. The plurality of local bit lines are connected to the channel body and commonly connected to the global bit line through the contact plug.

Embodiments will be described with reference to drawings. Following embodiments illustrate silicon as a semiconductor, however a semiconductor other than silicon may be used.

First Embodiment

Figure 1:
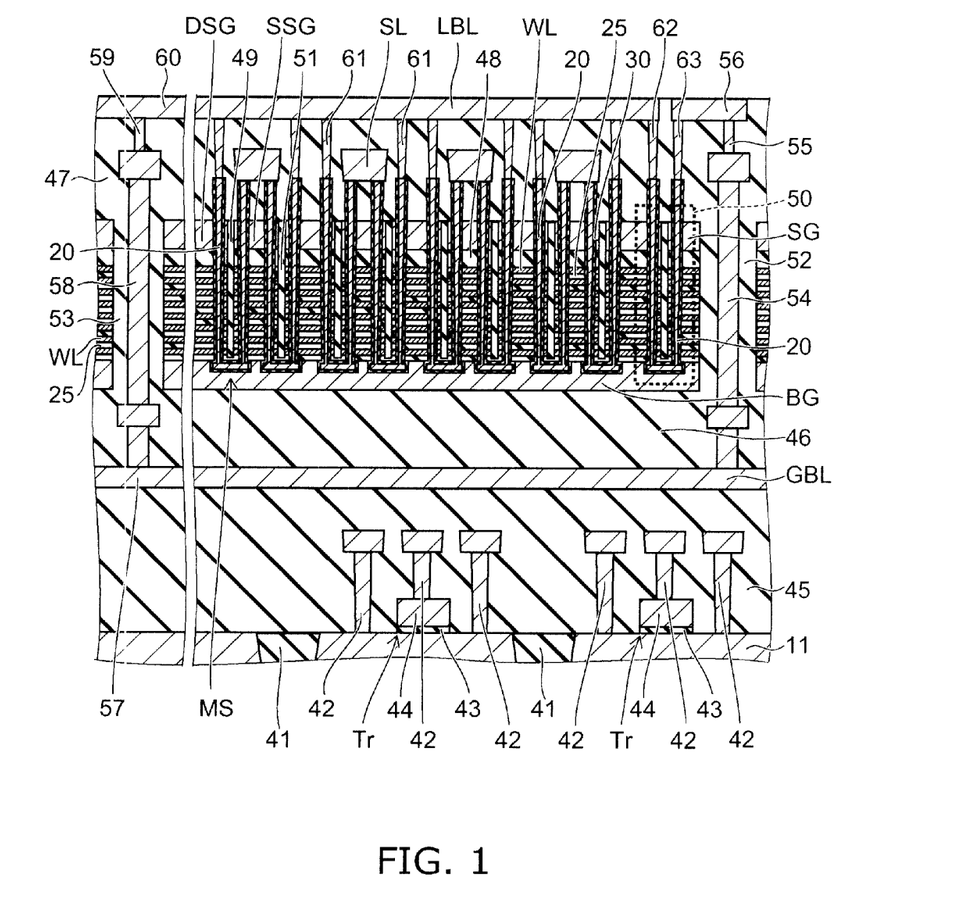
FIG. 1 is a schematic cross-sectional view of a semiconductor memory device according to a first embodiment.

FIG. 1 is a schematic cross-sectional view of a semiconductor memory device according to a first embodiment.

Figure 2:
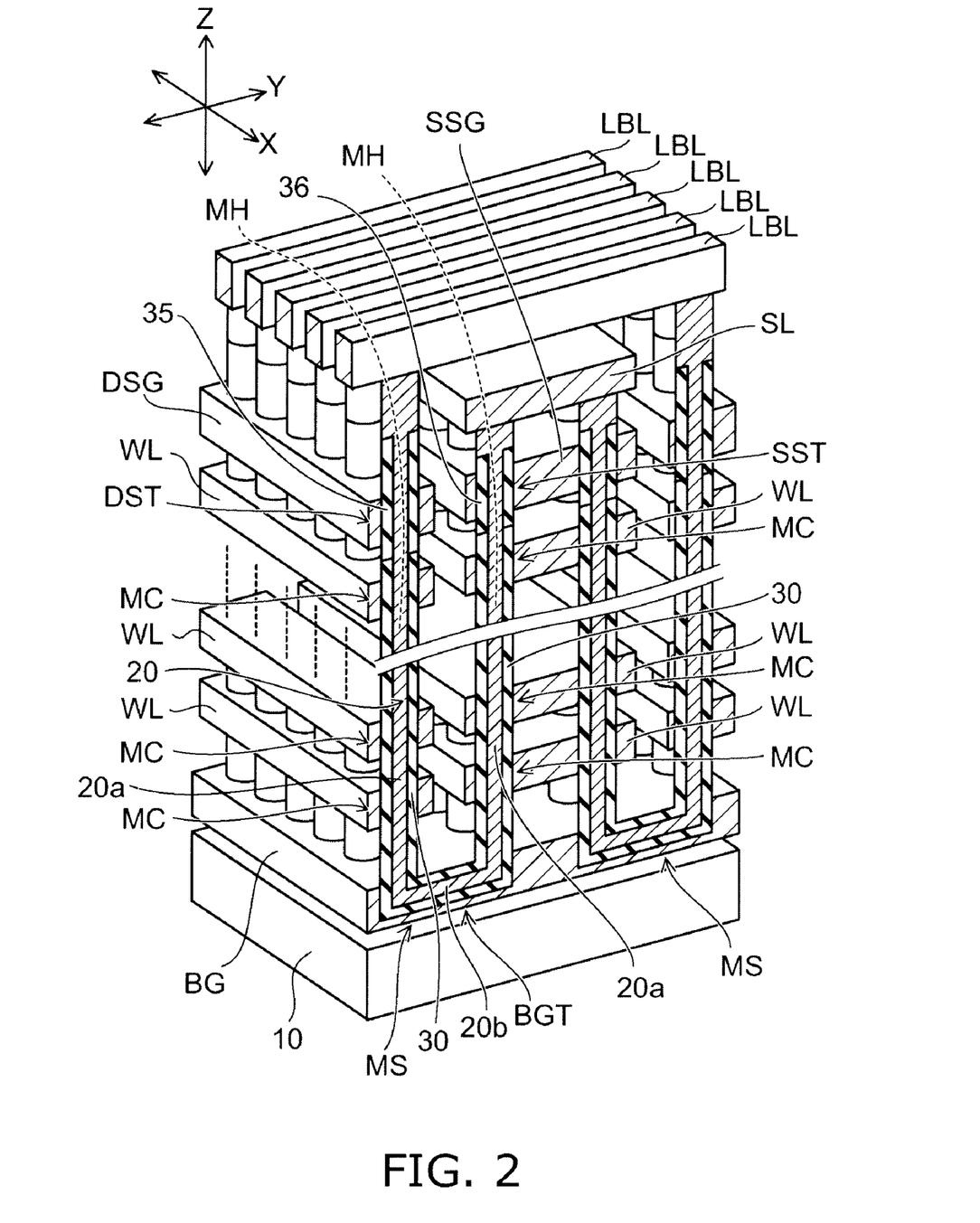
FIG. 2 is a schematic perspective view of a memory cell array of the semiconductor memory device.

FIG. 2 is a schematic perspective view of a memory cell array of the semiconductor memory device. FIG. 2 omits insulating portions other than an insulating film formed in a memory hole MH for conspicuous drawing.

Moreover, in the specification, an XYZ coordination system is introduced for convenience of description. In this coordination system, two directions parallel to a major surface of a base 10 and orthogonal to each other are taken to be a X direction and a Y direction, a direction perpendicular to both of these X direction and Y direction is taken to be a Z direction. FIG. 1 corresponds to a cross-section along the Y direction.

The base 10 shown in FIG. 2 includes a substrate 11 shown in FIG. 1 and a transistor Tr formed on a surface of the substrate 11. The transistor Tr includes a source region, a drain region, a gate insulating film 43 and a gate electrode 44 formed on the surface of the substrate 11, the gate electrode 44 being formed on the insulating film 43.

The transistor Tr is one element of a peripheral circuit such as a row decoder and a sense amplifier or the like. The peripheral circuit is formed as a semiconductor integrated circuit including the transistor Tr on the surface of the substrate 11 also including a lower region of a memory cell array. The transistor Tr is isolated from other transistors Tr by an element isolation region 41 having, for example, an STI (Shallow Trench Isolation) structure.

An insulating layer 45 is provided on the substrate 11. A global bit line GBL and a lower layer interconnection 57 are formed on the insulating layer 45. The global bit line GBL is formed in a memory cell array region provided with the memory cell array. The lower layer interconnection 57 is formed in a peripheral region laid outside the memory cell array region. The global bit line GBL and the lower layer interconnection 57 are placed in the same layer and simultaneously formed from the same conductive material. The global bit line GBL and the lower layer interconnection 57 are divided and electrically insulated.

The source region, the drain region and the gate electrode 44 of the transistor Tr are connected to the lower layer interconnection 57 or the global bit line GBL through a contact plug 42 and an interconnection not shown. The global bit line GBL is electrically connected to the sense amplifier of the peripheral circuit. The sense amplifier reads out data stored in the memory cell.

A back gate BG is provided on the insulating layer 45 through an insulating layer 46. The back gate BG is, for example, an impurity doped silicon layer having conductivity. A plurality of insulating layers 25 and a plurality of conductive layers WL are alternately stacked on the back gate BG. The conductive layers WL are, for example, impurity doped silicon layers having conductivity. The insulating layers 25 are, for example, TEOS (tetraethoxysilane) layers containing silicon oxide.

A stacked body including the back gate BG, the conductive layers WL and the insulating layers 25 is formed over the entire surface of the substrate 11. Alternatively, the above stacked body is not necessary to be provided in a region having the peripheral circuit laid out around the memory cell array region.

The stacked body including the conductive layers WL and the insulating layers 25 in the memory cell array region is divided into a plurality of blocks. An insulator 51 is provided between the respective blocks.

In the following, the memory cell array is described with reference to FIG. 2 as well.

A drain side selection gate DSG is provided above the uppermost conductive layer WL in a certain block through an insulating film (for example, silicon nitride film) 48. The drain side selection gate DSG is, for example, an impurity doped silicon layer having conductivity. A source side selection gate SSG is provided above the uppermost conductive layer WL in another block adjacent to the certain block through the insulating film 48. The source side selection gate SSG is, for example, an impurity doped silicon layer having conductivity. An insulating layer 49 intervenes between the drain side selection DSG and the source side selection gate SSG.

A source line SL is provided above the source side selection gate SSG through an insulating layer 47. The source line SL is, for example, an impurity doped silicon layer having conductivity or a metal layer. A plurality of local bit lines LBL are provided above the source line SL and the insulating layer 47. The respective local bit lines LBL are extending in the Y direction.

The back gate BG, each of the conductive layers WL, the drain side selection gate DSG, the source side selection gate SSG, the source line SL and the local bit lines LBL are operable electrically and independently.

A plurality of memory holes MH like a U-shape are formed in the aforementioned stacked body. The drain side selection gate DSG and holes punched through the underlying conductive layers WL and aligning in the Z direction are formed in a block including the drain side selection gate DSG, and the source side selection gate SSG and holes punched through the underlying conductive layers WL and aligning in the Z direction are formed in a block including the source side selection gate SSG. Those both holes are connected through a hole formed in the back gate BG and extending in the Y direction.

A channel body (for example, silicon film) 20 like a U-shape is provided in the memory hole MH. A gate insulating film 35 shown in FIG. 2 is formed on a sidewall of the memory hole MH between the drain side selection gate DSG and the channel body 20. A gate insulating film 36 shown in FIG. 2 is formed on a sidewall of the memory hole between the source side selection gate SSG and the channel body 20.

A memory film 30 is formed on a sidewall of the memory hole MH between the respective conductive layers WL and the channel body 20. The memory film 30 is also formed on an inner wall of the memory hole MH between the back gate BG and the channel body 20. The memory film 30 has an ONO (Oxide-Nitride-Oxide) structure to place a silicon nitride film between a pair of silicon oxide films.

Figure 3:
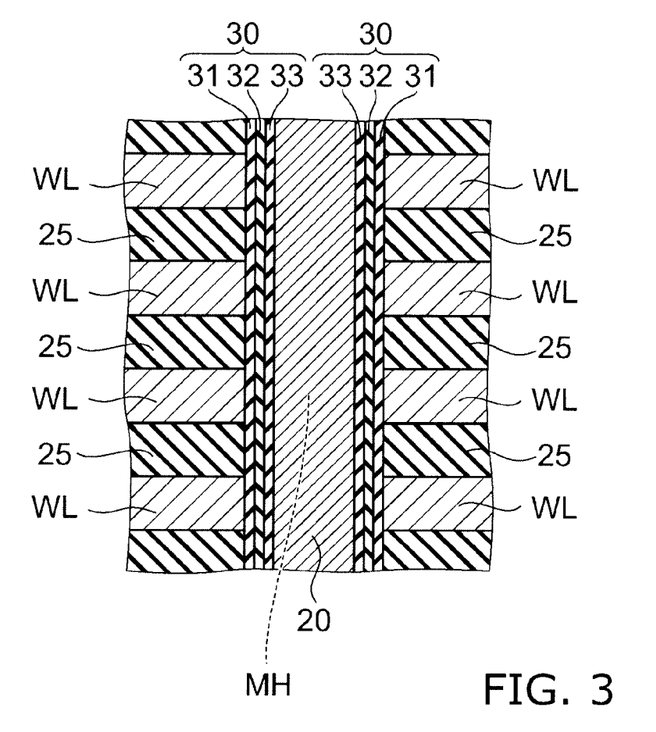
FIG. 3 is an enlarged cross-sectional view of a relevant part in FIG. 2.

FIG. 3 shows an enlarged cross-section of a portion of the channel body 20 piercing the plurality of conductive layers WL and the interlayer insulating layers 25.

A first insulating film 31, a charge storage film 32 and a second insulating film 32 are sequentially provided on the sidewall of the conductive layers WL between the respective conductive layers WL and the channel body 20. The first insulating film 31 is in contact with the conductive layers WL. The second insulating film 33 is in contact with the channel body 20. The charge storage film 32 is provided between the first insulating film 31 and the second insulating film 33.

The channel body 20 functions as a channel. The conductive layers WL function as control gates. The charge storage film 32 functions as a data memory layer storing charges injected from the channel body 20. That is, a memory cell having a structure which control gates surround a periphery of the channel is formed at respective intersections of the channel body 20 and the respective conductive layers WL.

The semiconductor memory device according to this embodiment is a non-volatile semiconductor memory device that can freely perform electrical erasing and writing of data and hold memory content even if power is turned off. For example, the memory has a charge trap structure. The charge storage film 32 has a lot of traps confining charges (electrons), being, for example, a silicon nitride film. The second insulating film 33 is, for example, a silicon oxide film. The second insulating film 33 serves as a potential barrier when charges are injected into the charge storage film 32 from the channel body 20 or when the charges stored in the charge storage film 32 diffuse into the channel body 20. The first insulating film 31 is, for example, a silicon oxide film, and prevents the charges stored in the charge storage film 32 from diffusing into the conductive layers WL.

The configuration of the memory film 30 is not limited to the above configuration. For example, the first insulating film 31 may have a stacked film structure to place a silicon nitride film between a pair of silicon oxide films.

As shown in FIG. 2, the drain side selection gate DSG, the channel body 20 piercing the drain side selection gate DSG, the gate insulating film 35 provided between this channel body 20 and the drain side selection gate DSG forms a drain side selection transistor DST. An upper end portion of the channel body 20 protruding above the drain side selection gate DSG is connected to the local bit line LBL through a plug 61 shown in FIG. 1.

The source side selection gate SSG, the channel body 20 piercing the source side selection gate SSG, the gate insulating film 36 provided between this channel body 20 and the source side selection gate SSG forms a source side selection transistor SST. An upper end portion of the channel body 20 protruding above the source side selection gate SSG is connected to the source line SL.

The back gate BG, the channel body 20 provided in this back gate BG and the memory film 30 between the back gate BG and the channel body 20 forms a back gate transistor BGT.

Between the drain side selection gate DST and the back gate transistor BGT, a memory cell MC having each of the conductive layers WL functioning as the control gate is provided in plurality in accordance with the number of the conductive layers WL.

Similarly, between the back gate transistor BGT and the source side selection transistor SST as well, a memory cell MC having each of the conductive layers WL functioning as the control gate is provided in plurality in accordance with the number of the conductive layers WL.

The memory cells MC, the drain side selection transistor DST, the back gate transistor BGT and the source side selection transistor SST are connected in series to form one memory string MS like a U-shape. That is, the channel body 20 is formed in a U-shape configuration having one pair of columnar portions 20a extending in a stacking direction of the stacked body and a connection 20b buried in the back gate BG to connect the pair of columnar portions 20a. The memory string MS like a U-shape is arrayed in plurality in the X direction and the Y direction, and hence the plurality of memory cells MC are provided three-dimensionally in the X direction, the Y direction and the Z direction.

Figure 4:
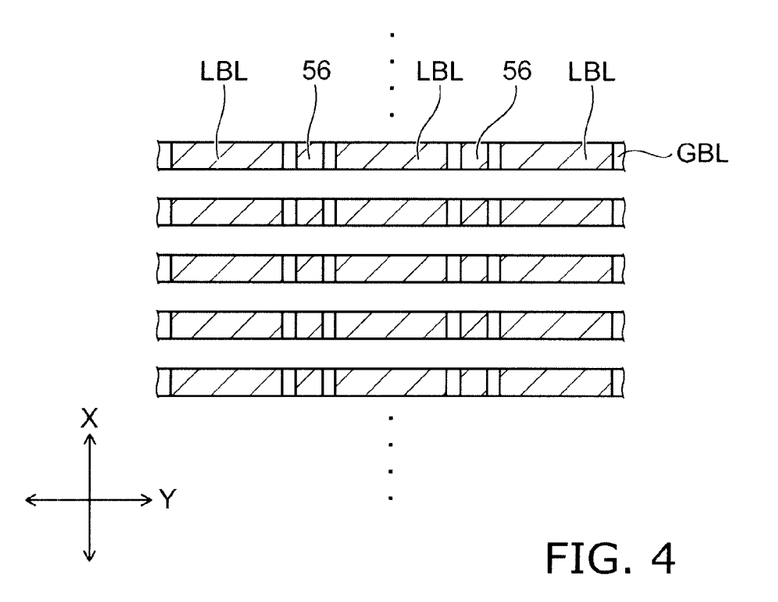
FIG. 4 is a schematic plan showing disposition relationship of local bit lines and global bit lines in the semiconductor memory device.

FIG. 4 shows a disposition relationship of the local bit lines LBL and the global bit lines GBL as viewed from above the local bit lines LBL. The X direction and the Y direction in FIG. 4 correspond to the X direction and the Y direction in FIG. 2, respectively.

The plurality of local bit lines LBL are laid out side by side in the X direction. Furthermore, the respective local bit lines LBL are divided into multiple portions in the Y direction. An interconnection 56 is formed between the respective local bit lines LBL divided in the Y direction.

As shown in FIG. 1, the interconnection 56 is placed in the same layer as the local bit lines LBL and made of the same conductive material. The insulating layer 47 intervenes between the respective local bit lines LBL and the interconnection 56.

A contact plug 54 piercing the stacked body including the drain side selection gate DSG and the source side selection gate SSG (hereinafter, these are merely referred to collectively as selection gates SG, too), the plurality of conductive layers WL, the plurality of insulating layers 25 and the back gate BG is provided under the interconnection 56.

An upper end portion of the contact plug 54 is connected to the interconnection 56 through a plug 55. A lower end portion of the contact plug 54 is connected to the global bit line GBL. An insulator 52 such as, for example, silicon oxide is provided between the contact plug 54 and the above stacked body. The contact plug 54 is electrically insulated to the selection gates SG, the conductive layers WL and the back gate BG.

A string having the channel body 20 like a U-shape includes the memory string MS connected between the local bit line LBL and the source line SL, and a contact string 50 connected between the local bit line LBL and the interconnection 56.

The memory string MS and the contact string 50 have the same structure although destinations to be connected are different. That is, the memory string MS and the contact string 50 have the structure that the channel body 20 is provided through the memory film 30 inside the hole being like a U shape, and both of them are formed simultaneously in the same process.

A plurality of the memory strings MS are connected to each of the plurality of local bit lines LBL divided in the Y direction. The channel body (memory string channel body) 20 of each of the memory strings MS is connected to each of the local bit lines LBL through the plug 61.

The contact string 50 is correspondingly provided with respect to each of the plurality of local bit lines LBL divided in the Y direction, at least one contact string 50 is correspondingly provided with respect to one local bit line LBL.

The channel body 20 (contact string channel body) of the contact string 50 is connected to the corresponding local bit line LBL through a plug 62. The contact string channel body is connected to the corresponding interconnection 56 through a plug 63. The interconnection 56 is connected to the corresponding contact plug 54 through the plug 55. The global bit line GBL is commonly provided with respect to the plurality of local bit lines LBL divided in the Y direction.

Therefore, each of the plurality of local bit lines LBL divided in the Y direction is electrically connected to one common global bit line GBL through the contact string 50, the interconnection 56 and the contact plug 54.

As shown in FIG. 4, the global bit line GBL extends in the Y direction likewise the local bit line LBL with the same width as the local bit line LBL and is laid out immediately below the local bit line LBL. The lay out like this shortens a contact path length between the local bit line LBL and the global bit line GBL to reduce the resistance between both lines. The local bit line LBL and the global bit line GBL are vertically overlapped to be laid out, and thereby area increase of the interconnection lay out can be suppressed.

As shown in FIG. 1, the upper layer interconnection 60 is formed in a peripheral region outside the memory array cell region. The upper layer interconnection 60 is placed in the same layer as the local bit line LBL and the interconnection 56 and is simultaneously formed of the same conductive material. The upper layer interconnection 60 is isolated from the local bit line LBL and the interconnection 56.

A contact plug 58 piercing the aforementioned stacked body is provided below the upper layer interconnection 60. An upper end portion of the contact plug 58 is connected to the upper layer interconnection 60 through a plug 59. A lower end portion of the contact plug 58 is connected to the lower layer interconnection 57. An insulator 53 such as, for example, silicon oxide is provided between the contact plug 58 and the above stacked body. The contact plug 58 is electrically insulated from the selection gates SG, the conductive layers WL and the back gate BG.

The stacked body including the selection gates SG, the plurality of conductive layers WL, the plurality of insulating layers 25 and the back gate BG is provided in not only the memory cell array region but also its peripheral region as a dummy layer not electrically connecting with conductive portions such as other interconnections. Therefore, a large step is not formed on the substrate 11. This causes the process to be easy and structural defects can be suppressed.

The memory cell having the aforementioned structure does not form a channel on the substrate surface. Therefore, the peripheral circuit can be formed on the surface of the substrate 11 and the memory cell array can be provided thereabove. That is, it is not necessary to form the memory cell array and the peripheral circuit three-dimensionally or to lay out separately on another plane, and a chip size can be downsized.

In this embodiment, the local bit line LBL being extended in the Y direction above the stacked body and connected to the memory string MS is divided into plurality in the Y direction being its extending direction. The respective local bit lines LBL are connected to the global bit line GBL being common between the plurality of local bit lines LBL provided in line in the Y direction through the contact string 50 and the contact plug 54.

This structure can reduce the number of the memory strings MS being connected to one local bit line LBL extending in the Y direction. And this structure can reduce the effect of an off leak current during reading the data in comparison with the structure that all memory strings MS adjacent to each other in the Y direction are connected to one common bit line.

During reading the data, the channel body 20 of the contact string 50 connected to a non-selection local bit line LBL is turned off by potential control of the selection gates SG and the conductive layers WL. That is, the non-selection local bit line LBL is blocked to the global bit line GBL by the contact string 50 in the off state. The contact string 50 connected to the selection local bit line LBL is turned on by potential control of the selection gates SG and the conductive layers WL.

Therefore, during reading the data, the only selection local bit line LBL can be electrically connected to the sense amplifier through the global bit line GBL, and the data can be accurately read by reducing the ratio of the off leak current to the reading current.

The global bit line GBL is provided in a layer between the peripheral circuit and the aforementioned stacked body, and thereby can be simultaneously formed in the same process as the process for another lower layer interconnection 57 for the peripheral circuit. The local bit line LBL can be simultaneously formed in the same process as the process for other upper layer interconnection 60 above the stacked body. Therefore, the bit lines are separately formed into two layers by placing the stacked body between the two layers, however the number of processes does not increase. This process causes no significant increase of cost.

Next, a method for manufacturing a semiconductor memory device according to this embodiment is described.

First, the transistor Tr forming the peripheral circuit is formed on the surface of the substrate (for example, silicon substrate) 11. Specifically, the element isolation region 41, the source region, the drain region, the gate insulating film 43, the gate electrode 44 and the like are formed by using lithography method, RIE (Reactive Ion Etching) method, ion injection method and the like.

Next, the insulating layer 45 is deposited on the substrate 11 and the plug 42 and interconnection connected to the transistor Tr are formed. Furthermore, the global bit line GBL and the lower layer interconnection 57 are simultaneously formed on the insulating layer 45.

Next, the insulating layer 46 is formed on the global bit line GBL and the lower layer interconnection 57 and the back gate BG is formed on the insulating layer 46. Next, a recess is formed in the back gate BG, and then a sacrificial film (for example, silicon nitride film) is buried in the recess.

Next, the insulating layers 25 and the conductive layers WL are alternately stacked in plurality on the back gate BG. After formation of the stacked body, a hole punched through the stacked body and reaching the sacrificial film buried in the back gate BG is formed. The silicon nitride film is also illustratively buried in the hole as the sacrificial film.

Next, the sacrificial film in the hole of the stacked body and the sacrificial film buried in the back gate BG are removed by using, for example, hot phosphoric acid solution. Thus, the memory hole like a U-shape is formed in the stacked body and the back gate BG.

Next, the memory film 30 is formed on an inner wall of the memory hole MH. Moreover, a silicon film serving as the channel body 20 is formed inside the memory film 30 in the memory hole MH. At this time, it is desired that the inside of the memory hole MH is not completely buried with the silicon film and the silicon film is formed so as to leave a cavity in the memory hole MH. This defines a film thickness of the channel body 20 by a deposited film thickness of the silicon film independently of variation of a hole diameter of the memory hole MH. After that, the surface of the silicon film is oxidized and then a silicon oxide film is buried in the left cavity in the memory hole MH by, for example, CVD (Chemical Vapor Deposition) method.

Next, slits are formed in the stacked body and the stacked body is divided into a plurality of blocks. After that, a metal (for example, cobalt) film is formed on a sidewall of the slit by, for example, CVD method to be subjected to thermal treatment. This forms a metal silicide film in a portion facing the slit of the conductive layer WL. After that, an unreacted portion of the metal film is removed by using, for example, a mixed solution of sulfuric acid and hydrogen peroxide solution and the insulator (for example, silicon nitride film) 51 is buried. The above metal silicide may not be formed.

After that, the conductive layer (for example, silicon layer) serving as the selection gate SG is deposited on the stacked body and the conductive layer is patterned to be processed into a line configuration. The insulating layer 49 is buried in a selectively removed portion of the conductive layer WL.

After that, a dummy hole punched through the stacked body is formed in a portion where the contact plugs 54, 58 are formed and the insulators (for example, silicon oxide film) 52, 53 are buried in the dummy hole.

Next, after the contact holes punched through the insulators 52, 53, respectively are formed, the contact plugs 54, 58 are provided in the contact holes. The lower end portion of the contact plug 54 is connected to the global bit line GBL and the contact plug 58 is connected to the lower layer interconnection 57. The contact plugs 54, 58 are simultaneously formed. The contact plugs 54, 58 include, for example, a titanium film, a titanium nitride film and a tungsten film formed sequentially from the inner wall side of the contact hole.

Next, the source line SL, the plugs 59, 61, 62, 63, 55, the local bit line LBL, the interconnection 56, the upper layer interconnection 60 or the like are formed on the stacked body. The local bit line LBL, the interconnection 56 and the upper layer interconnection 60 are simultaneously formed of the same material.

Next, another embodiment of the invention is described. In drawings referred in following descriptions, the same components as those in the above first embodiment are marked with the same numerals.

Second Embodiment

Figure 5:
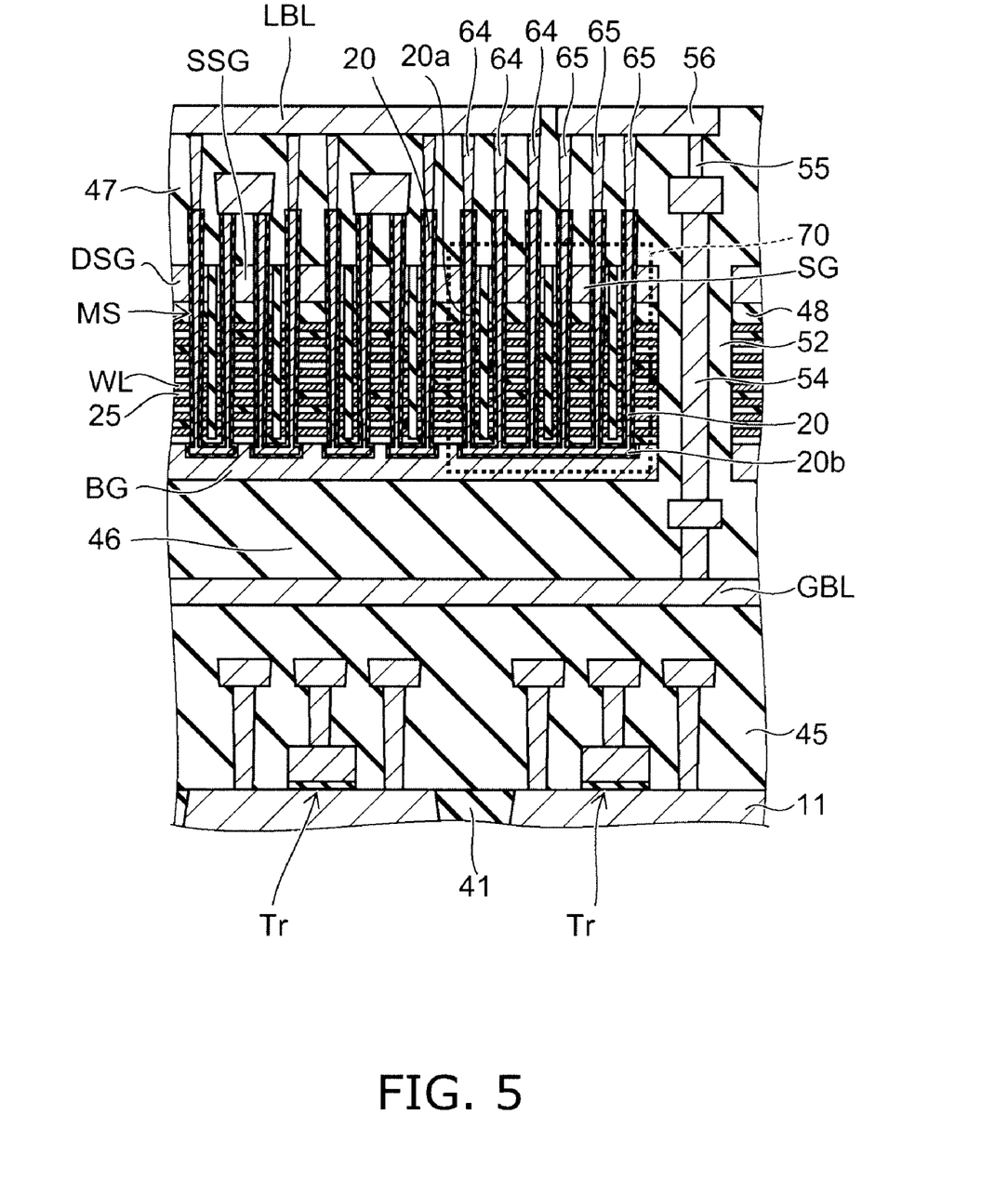
FIG. 5 is a schematic cross-sectional view of the semiconductor memory device according to a second embodiment.

FIG. 5 is a schematic cross-sectional view of a semiconductor memory device according to a second embodiment.

In this embodiment, the local bit line LBL is connected to the interconnection 56 through a contact string 70. The contact string 70 includes a plurality (for example, three in the figure) of the aforementioned channel bodies 20 like a U-shape.

End portions of a plurality (for example, six in the figure) of columnar portions 20a in the channel body 20 of the contact string 70 are connected to each other through the connection 20b buried in the back gate BG. That is, the respective connections 20b of the strings are mutually connected to be formed together and commonly provided to the plurality of columnar portions 20a. The upper end portions of three columnar portions 20a on the memory array side of six columnar portions 20a are connected to the local bit line LBL through the plugs 64, the upper end portions of three columnar portions 20a on the contact plug 54 side are connected to the interconnection 56 through plugs 65. Therefore, the plurality of columnar portions 20a are connected in parallel between the local bit line LBL and the interconnection 56.

Consequently, a resistance between the local bit line LBL and the global bit line GBL can be lowered and detection sensitivity of the sense current during reading the data to the selection local bit line LBL can be improved.

Third Embodiment

Figure 6:
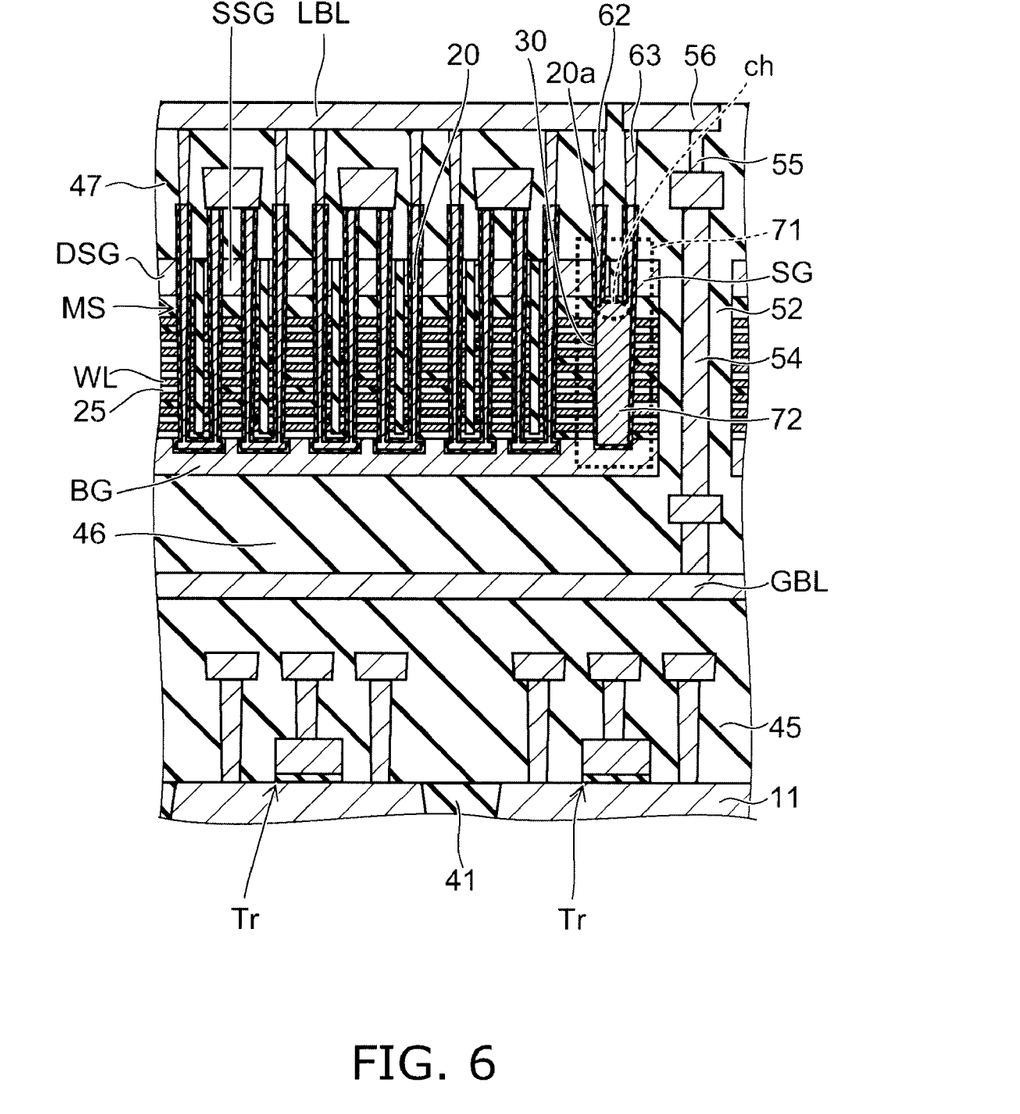
FIG. 6 is a schematic cross-sectional view of a semiconductor memory device according to a third embodiment.

FIG. 6 is a schematic cross-sectional view of a semiconductor memory device according to a third embodiment.

In this embodiment, the local bit line LBL is connected to the interconnection 56 through a contact string 71. The contact string 71 includes a pair of the columnar portions 20a and a body 72.

The pair of columnar portions 20a pierce the selection gate SG, one of the respective upper end portions is connected to the local bit line LBL through the plug 62 and the other of the respective upper end portions is connected to the interconnection 56 through the plug 63.

The body 72 is provided in a portion piercing the plurality of conductive layers WL and the plurality of insulating layers 25 and has a structure that a portion surrounded by a bottom of the aforementioned channel body 20 like a U-shape and the pair of the columnar portions 20a is buried with conductive material (for example, silicon). Therefore, a width of the body 72 is larger than a combined width of the pair of the columnar portions 20a in one of the string.

Figure 7:
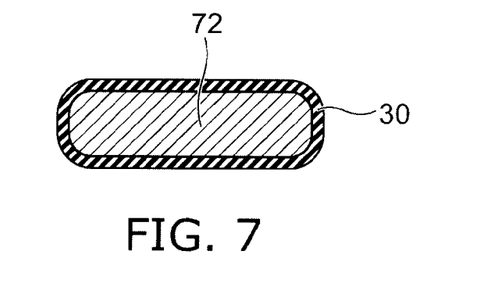
FIG. 7 is a schematic cross-sectional view of a relevant part in FIG. 6.

FIG. 7 shows a cross-sectional view of the body 72. The memory film 30 being the insulating film intervenes between the stacked body including the conductive layers WL and the body 72, and the conductive layers WL are insulated from the body 72. The memory film 30 can be simultaneously formed with the memory film 30 of the memory string MS. The body 72 can also be simultaneously formed of the same material as that of the channel body 20 of the memory string MS.

During reading the data, a desired potential is applied to the selection gate SG and the pair of the columnar portions 20a piercing the selection gate SG is turned on. Furthermore, a desired potential is applied to the conductive layers WL and the channel is also formed in the body 72. The body 72 has a larger cross-sectional area than the columnar portions 20a of the memory string MS, and hence the channel cross-sectional area can be enlarged and a resistance of the contact string 71 can be lowered.

Alternatively, even if the body 72 is not turned on, turning on the pair of columnar portions 20a piercing the selection gate SG allows the channel ch to be formed immediately below the selection gate SG in the body 72. The current flows from one columnar portion 20a of the pair of the columnar portions 20a to the other columnar portion 20a through the channel ch immediately below the selection gate SG, the current path can be more shortened than through the portion piercing the stacked body. The resistance of the contact string can be lowered. This can improve the detection sensitivity to the sense current.

In this embodiment, the resistance of the contact string can be lowered while suppressing increase of the number of the contact string, namely, increase of the area occupied by the contact string.

Fourth Embodiment

Figure 8:
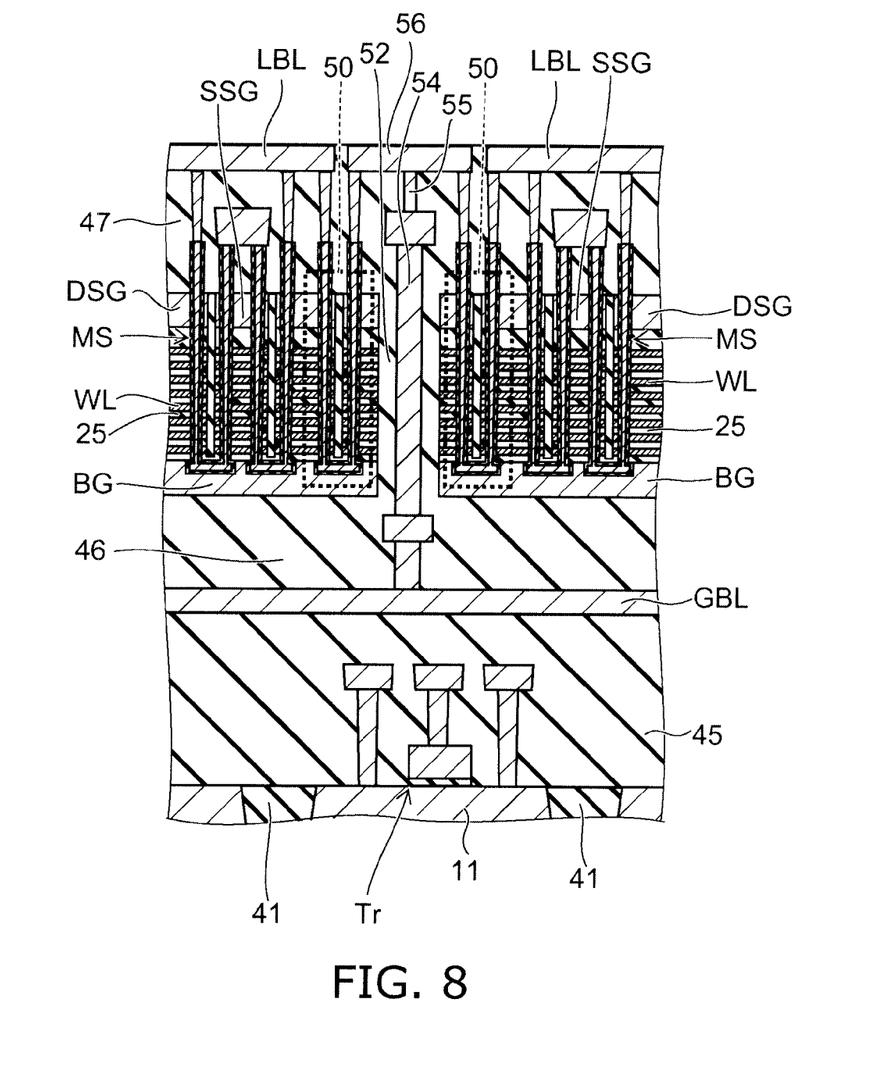
FIG. 8 is a schematic cross-sectional view of a semiconductor device according to a fourth embodiment.

FIG. 8 is a schematic cross-sectional view of a semiconductor memory device according to a fourth embodiment.

In this embodiment, the contact plug 54 is shared between the plurality of local bit lines LBL divided along the aforementioned Y direction (extending direction of the local bit lines LBL). That is, two adjacent local bit lines LBL placing the contact plug 54 therebetween in the Y direction are connected to one interconnection 56 and the contact plug 54, respectively through the contact string 50.

The planar size of the device can be decreased by sharing the contact plug 54 between the adjacent local bit lines LBL in the Y direction.

Fifth Embodiment

Figure 9:
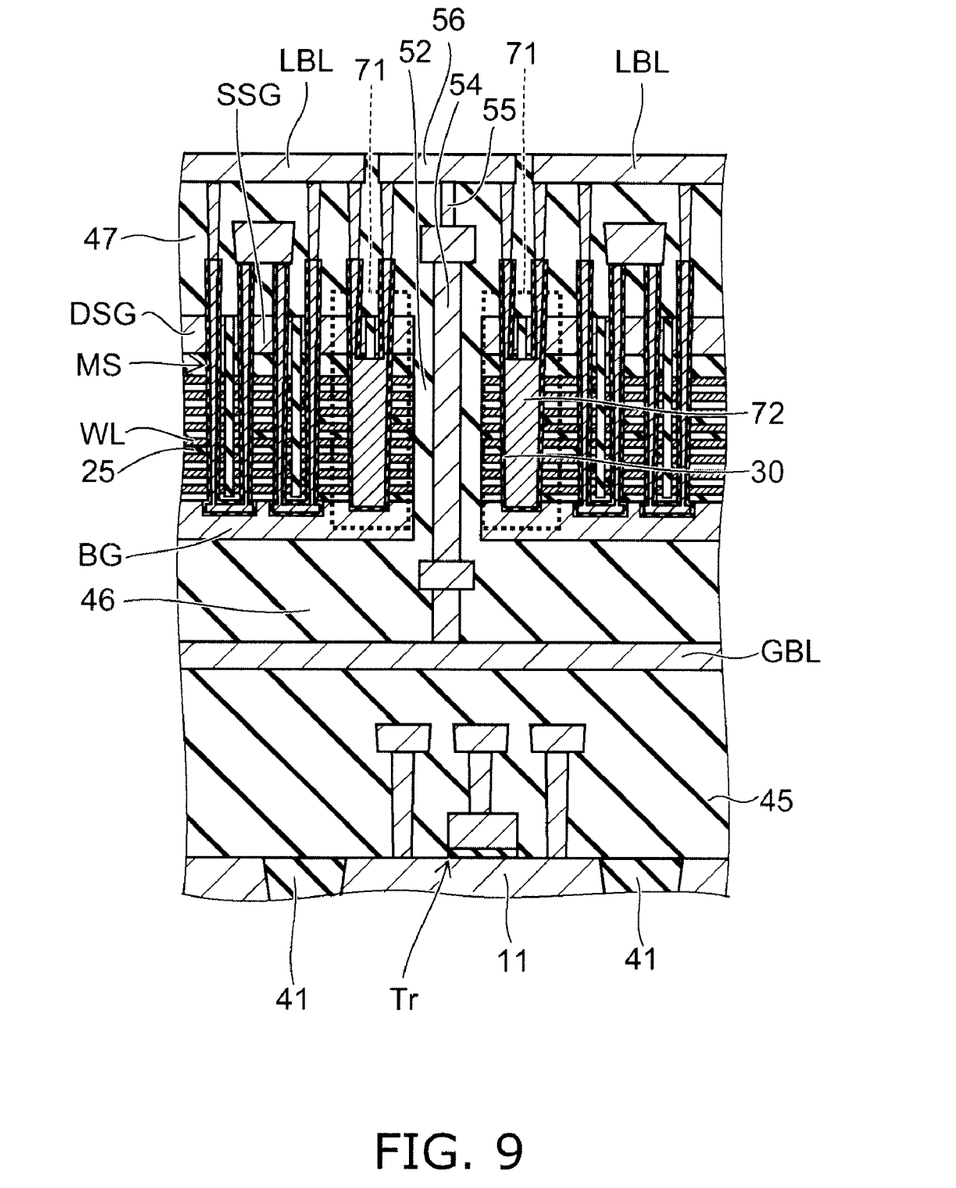
FIG. 9 is a schematic cross-sectional view of a semiconductor device according to a fifth embodiment.

In the configuration where the contact plug 54 is shared between the adjacent local bit lines LBL in the aforementioned Y direction, the contact string may be based on the contact string 71 in the above third embodiment as shown in FIG. 9.

The embodiments have been described with reference to the specific examples. However, the invention is not limited thereto, but can be variously modified in accordance with the spirit of the invention.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
    a base having a substrate and a peripheral circuit formed on the substrate;
    a stacked body having a plurality of conductive layers and insulating layers stacked alternately above the base;
    a memory film including a charge storage film provided on an inner wall of a memory hole formed in a stacking direction of the stacked body;
    a channel body provided inside the memory film in the memory hole;
    a contact plug provided by piercing the stacked body;
    a global bit line provided between the peripheral circuit and the stacked body and connected to a lower end portion of the contact plug; and
    a plurality of local bit lines provided above the stacked body and divided in an extending direction of the plurality of local bit lines, the plurality of local bit lines connected to the channel body and commonly connected to the global bit line through the contact plug.

2. The device according to claim 1, wherein the adjacent two local bit lines placing the contact plug between the two local bit lines in the extending direction are commonly connected to the contact plug.

3. The device according to claim 1, further comprising a source line electrically operable independently of the local bit lines, the global bit line and the conductive layers.

4. The device according to claim 3, wherein
    the source line is provided on the stacked body,
    the channel body is formed in a U-shape configuration having a pair of columnar portions extending in a stacking direction of the stacked body and a connection buried in a bottom of the stacked body and connecting the pair of columnar portions.

5. The device according to claim 3, wherein
    the channel body includes:
    a memory string channel body connected between one of the local bit lines and the source line; and a contact channel body connected between one of the local bit lines and the contact plug.

6. The device according to claim 5, wherein
a plurality of the contact channel body are connected in parallel between one of the local bit lines and the contact plug.

7. The device according to claim 5, wherein
the memory string channel body is formed in a U-shape configuration having a pair of columnar portions extending in a stacking direction of the stacked body and a connection buried in a bottom of the stacked body and connecting the pair of columnar portions,
the contact channel body has a conductive body having a width larger than a combined width of the pair of columnar portions.

8. The device according to claim 5, further comprising an interconnection provided in a layer equal to a layer being provided with the local bit lines, formed of a material equal to a material forming the local bit lines and connecting the contact channel body to the contact plug.

9. The device according to claim 1, wherein
the global bit line has a width and a extending direction equal to a width and a extending direction of the local bit lines, and is laid out immediately below one of the local bit lines.

10. The device according to claim 5, further comprising a first selection gate configured to switch turning on and off between the contact channel body and one of the local bit lines and a second selection gate configured to switch turning on and off between the contact channel body and the contact plug.

11. The device according to claim 10, wherein
the contact channel body connected to a non-selection local bit line of the local bit lines during reading is blocked to the global bit line by the first selection gate and the second selection gate.

12. A method for manufacturing a semiconductor memory device comprising:
forming a peripheral circuit on a surface of a substrate;
forming a global bit line above the peripheral circuit;
alternately stacking a plurality of conductive layers with a plurality of insulating layers above the global bit line to form a stacked body;
forming a memory hole in the stacked body;
forming a memory film including a charge storage film on an inner wall of the memory hole;
forming a channel body inside the memory film in the memory hole;
forming a contact plug connected to the global bit line by piercing the stacked body; and
forming a plurality of local bit lines above the stacked body, the plurality of local bit lines connected to the channel body and the contact plug and divided in an extending direction of the plurality of local bit lines.

13. The method according to claim 12, wherein the global bit line is simultaneously formed with a lower layer interconnection using a material equal to a material forming the lower layer interconnection in forming the lower layer interconnection to be connected to the peripheral circuit above the peripheral circuit.

14. The method according to claim 13, wherein the local bit lines are simultaneously formed with an upper layer interconnection using a material equal to a material forming an upper layer interconnection in forming the upper layer interconnection to be connected to the lower layer interconnection above the stacked body.

* * * * *